(12) United States Patent
Sato et al.

(10) Patent No.: US 11,960,355 B2
(45) Date of Patent: *Apr. 16, 2024

(54) MEMORY SYSTEM

(71) Applicant: Kioxia Corporation, Tokyo (JP)

(72) Inventors: Masayoshi Sato, Yokohama Kanagawa (JP); Kenichiro Suzuki, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/405,891

(22) Filed: Aug. 18, 2021

(65) Prior Publication Data

US 2021/0373992 A1 Dec. 2, 2021

Related U.S. Application Data

(63) Continuation of application No. 16/409,986, filed on May 13, 2019, now Pat. No. 11,099,927, which is a continuation of application No. 15/002,244, filed on Jan. 20, 2016, now Pat. No. 10,289,475.

(60) Provisional application No. 62/127,152, filed on Mar. 2, 2015, provisional application No. 62/105,959, filed on Jan. 21, 2015.

(30) Foreign Application Priority Data

Mar. 4, 2015 (JP) .................................. 2015-042729

(51) Int. Cl.
G06F 11/07 (2006.01)
G06F 11/10 (2006.01)
G06F 13/42 (2006.01)
G11C 16/00 (2006.01)

(52) U.S. Cl.
CPC ........ *G06F 11/0793* (2013.01); *G06F 11/073* (2013.01); *G06F 11/1048* (2013.01); *G06F 11/108* (2013.01); *G06F 13/4282* (2013.01); *G11C 16/00* (2013.01)

(58) Field of Classification Search
CPC . G06F 11/0793; G06F 11/073; G06F 13/4282
USPC ...................................................... 714/6.11
See application file for complete search history.

(56) References Cited

U.S. PATENT DOCUMENTS

| 6,115,771 | A | 9/2000 | Born |
| 8,438,457 | B2 | 5/2013 | Koshiyama et al. |
| 8,583,835 | B1 | 11/2013 | Kan |
| 10,289,475 | B2 * | 5/2019 | Sato .................... G06F 13/4282 |
| 2009/0319859 | A1 * | 12/2009 | Alrod .................. G06F 11/1068 714/752 |
| 2011/0066923 | A1 | 3/2011 | Koshiyama et al. |

(Continued)

FOREIGN PATENT DOCUMENTS

| JP | 2009-217754 A | 9/2009 |
| JP | 2011-081776 A | 4/2011 |
| JP | 2012-084127 A | 4/2012 |

*Primary Examiner* — Yair Leibovich
(74) *Attorney, Agent, or Firm* — Maier & Maier, PLLC

(57) ABSTRACT

According to one embodiment, a memory system includes a first memory, an interface circuit, and a processor. The interface circuit is configured to receive a first request from an external device. The processor is configured to select a mode among a plurality of modes in response to the first request, and perform, on data read from the first memory, error correction of the selected mode.

14 Claims, 17 Drawing Sheets

(56) References Cited

U.S. PATENT DOCUMENTS

| | | |
|---|---|---|
| 2012/0072798 A1 | 3/2012 | Unesaki et al. |
| 2012/0079174 A1 | 3/2012 | Nellans et al. |
| 2012/0124448 A1 | 5/2012 | Emerson et al. |
| 2012/0173951 A1 | 7/2012 | Kong et al. |
| 2013/0246839 A1 | 9/2013 | Werner et al. |
| 2014/0059277 A1 | 2/2014 | Chung |
| 2015/0121167 A1* | 4/2015 | Goodman ............ G06F 11/1076 714/764 |
| 2015/0131512 A1* | 5/2015 | Lauer ................. H04L 27/0008 370/312 |
| 2015/0256205 A1 | 9/2015 | Katagiri et al. |
| 2016/0034354 A1 | 2/2016 | Hashimoto et al. |

\* cited by examiner

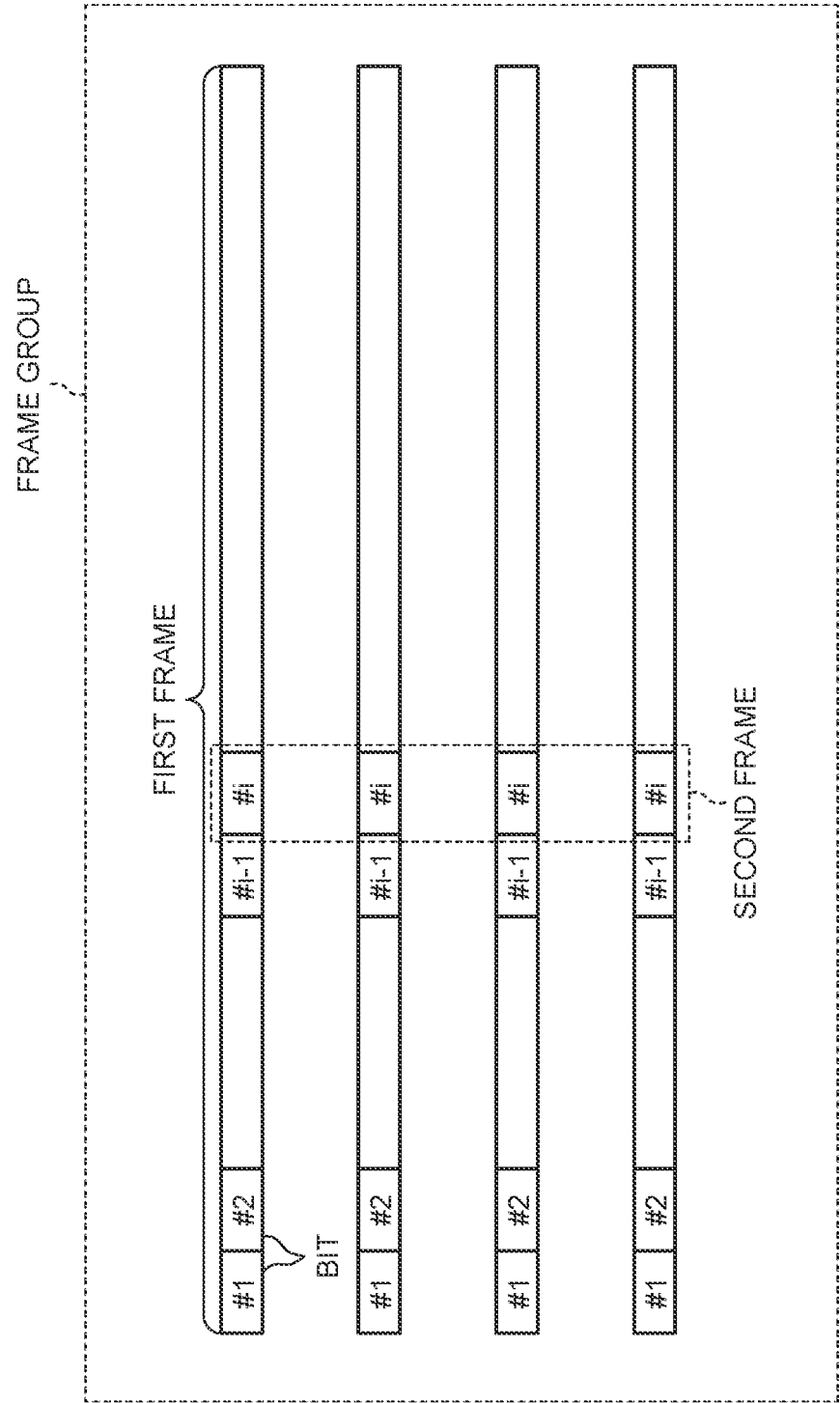

FIG.6

```
                                              ┌─101
┌─────────────────────────────────────────────┐
│ Level 1: CORRECTION CAPABILITY 10 bits,     │
│ CORRECTION TIME 3 μs                        │
│ Level 2: CORRECTION CAPABILITY 20 bits,     │
│ CORRECTION TIME 10 μs                       │
│ Level 3: CORRECTION CAPABILITY 30 bits,     │
│ CORRECTION TIME 15 μs                       │
│ Level 4: CORRECTION CAPABILITY 40 bits,     │
│ CORRECTION TIME 30 μs                       │
└─────────────────────────────────────────────┘
```

FIG.7

```
              ┌─102
┌─────────────────────────┐
│ Level 1: Enabled        │
│ Level 2: Enabled        │
│ Level 3: Disabled       │
│ Level 4: Disabled       │
└─────────────────────────┘
```

FIG. 14

| Byte\ | Bit7 | Bit6 | Bit5 | Bit4 | Bit3 | Bit2 | Bit1 | Bit0 |
|---|---|---|---|---|---|---|---|---|
| 0 | Peripheral Qualifier | | | Peripheral Device Type | | | | |
| 1 | PAGE Code (3Eh) | | | | | | | |
| 2-3 | Page Length (xxh) | | | | | | | |
| 4 | Error Correction Level Descriptor List (Level1) | | | | | | | |
| 5-7 | Level No. | | | | | | | |
| 8-11 | Error CORRECTION CAPABILITY (UNIT: bit) | | | | | | | |
| | Error CORRECTION TIME (UNIT: μs) | | | | | | | |
| | Error Correction Level Descriptor List (Level2) | | | | | | | |
| | Error Correction Level Descriptor List (Level3) | | | | | | | |
| | Error Correction Level Descriptor List (Level4) | | | | | | | |

FIG.15

| Byte | Bit7 | Bit6 | Bit5 | Bit4 | Bit3 | Bit2 | Bit1 | Bit0 |
|---|---|---|---|---|---|---|---|---|
| 0 | SP | SPF (0b) | PAGE CODE (35h) | | | | | |
| 1 | PAGE LENGTH (0Eh) | | | | | | | |
| 2 | D_Level1 | D_Level2 | D_Level3 | D_Level4 | Reserved | | | |
| 3 | Reserved | | | | | | | |
| 15 | | | | | | | | |

MEMORY SYSTEM

CROSS-REFERENCE TO RELATED APPLICATIONS

This application is a continuation of application Ser. No. 16/409,986, filed on May 13, 2019 (now U.S. Pat. No. 11,099,927, issues on Aug. 24, 2021), which is a continuation of U.S. application Ser. No. 15/002,244, filed on Jan. 20, 2016 (now U.S. Pat. No. 10,289,475) and is based upon and claims the benefit of priority from U.S. Provisional Application No. 62/105,959, filed on Jan. 21, 2015; U.S. Provisional Application No. 62/127,152, filed on Mar. 2, 2015; and Japanese Patent Application No. 2015-042729, filed on Mar. 4, 2015; the entire contents of all of which are incorporated herein by reference.

FIELD

Embodiments described herein relate generally to a memory system.

BACKGROUND

Conventionally, a memory system includes a memory which functions as a storage for data. An error may occur in the data stored in the memory. The memory system has a function (an error correction function) to correct the error included in the data. The memory system may include a plurality of error correction functions each having correction capability different respectively.

BRIEF DESCRIPTION OF THE DRAWINGS

FIG. 5 is a diagram illustrating an exemplary configuration of a frame for a level-3 correction;

FIG. 6 is a diagram illustrating an exemplary configuration of data of a first list;

FIG. 7 is a diagram illustrating an exemplary configuration of data of first setting information;

FIG. 14 is a diagram illustrating an example of a response;

FIG. 15 is a diagram illustrating an exemplary configuration of another data of the first setting information;

DETAILED DESCRIPTION

In general, according to one embodiment, a memory system includes a first memory, an interface circuit, and a processor. The interface circuit is configured to receive a first request from an external device. The processor is configured to select a mode among a plurality of modes in response to the first request, and perform, on data read from the first memory, error correction of the selected mode.

Exemplary embodiments of a memory system will be explained below in detail with reference to the accompanying drawings. The present invention is not limited to the following embodiments.

First Embodiment

Figure 1:
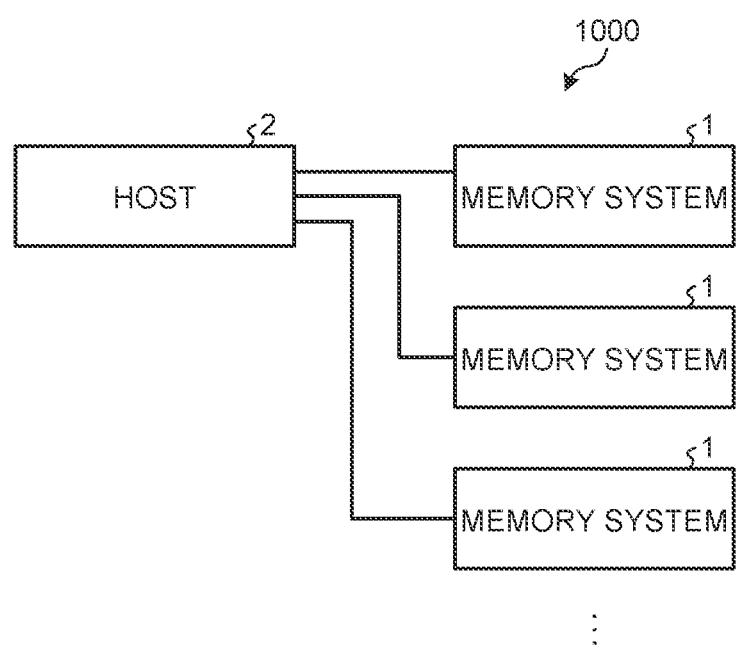
FIG. 1 is a diagram illustrating an exemplary installation of a first embodiment of a memory system.

FIG. 1 is a diagram illustrating an exemplary installation of a first embodiment of the memory system. An information processing system 1000 includes a host 2 and a plurality of memory systems 1. Each memory system 1 is connected to the host 2, and serves as an external memory apparatus of the host 2. The host 2 can issue an access request to the memory system 1. The access request includes a write request which is a request for writing data and a read request which is a request for reading data. As a communication interface standard between each memory system 1 and the host 2, any interface standard may be employed. For example, a small computer system interface (SCSI) standard, a serial attached SCSI (SAS) standard, a PCI Express standard, a serial ATA (SATA) standard, and the like may be employed.

Figure 2:
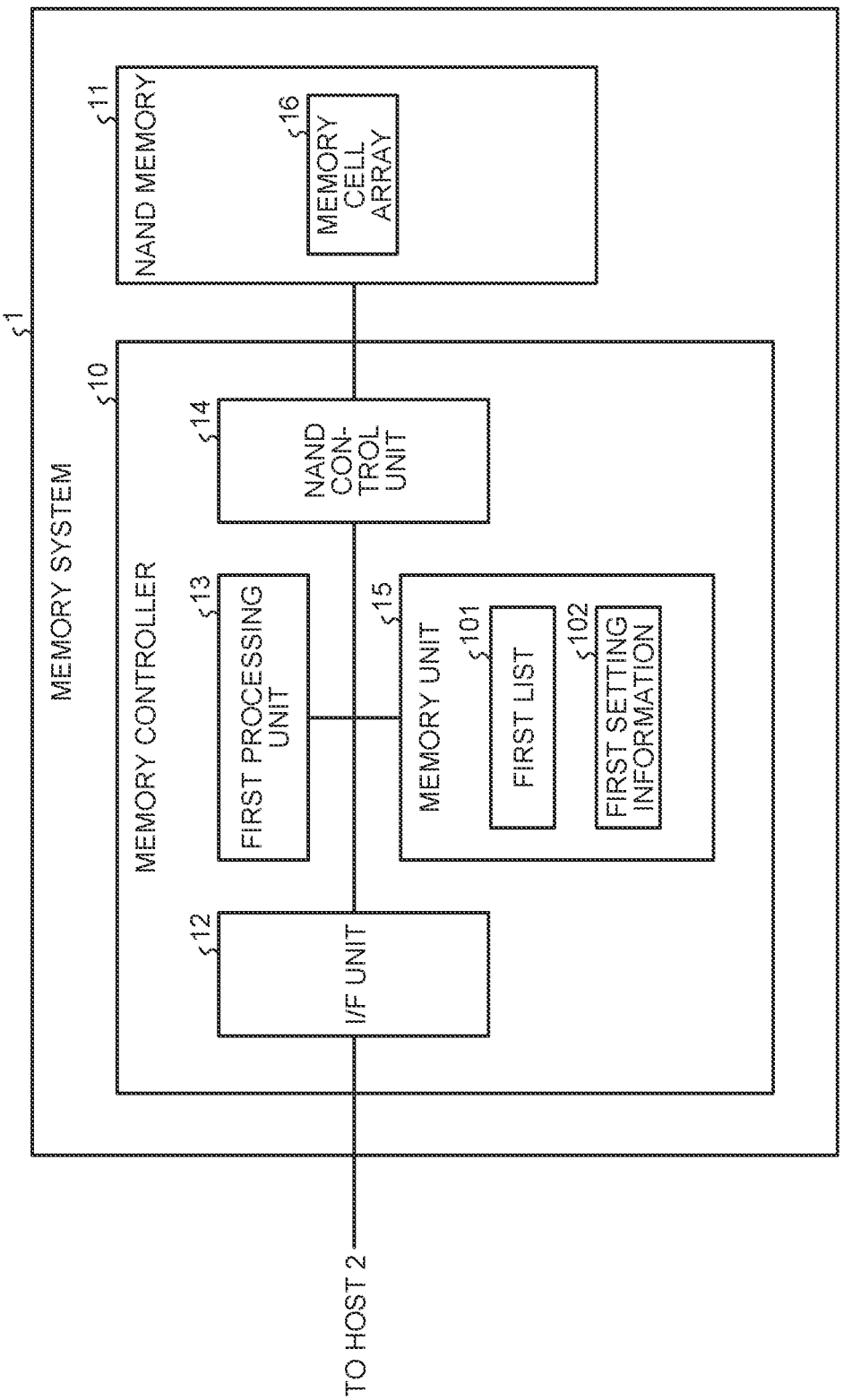
FIG. 2 is a diagram illustrating an exemplary configuration of the memory system.

The respective memory systems 1, for example, have the same configuration. FIG. 2 is a diagram illustrating an exemplary configuration of the memory system 1.

The memory system 1 includes a memory controller 10 and a NAND flash memory (a NAND memory) 11. The NAND memory 11 is a memory functioning as a storage. As the storage, another kind of memory instead of the NAND flash memory may be employed. For example, a NOR flash memory, a resistive random access memory (ReRAM), a magnetoresistive random access memory (MRAM), a magnetic disk, or the like may be employed as the storage.

The NAND memory 11 includes a memory cell array 16. The memory cell array 16 is configured to include a plurality of blocks which are each a unit of erase.

Figure 3:
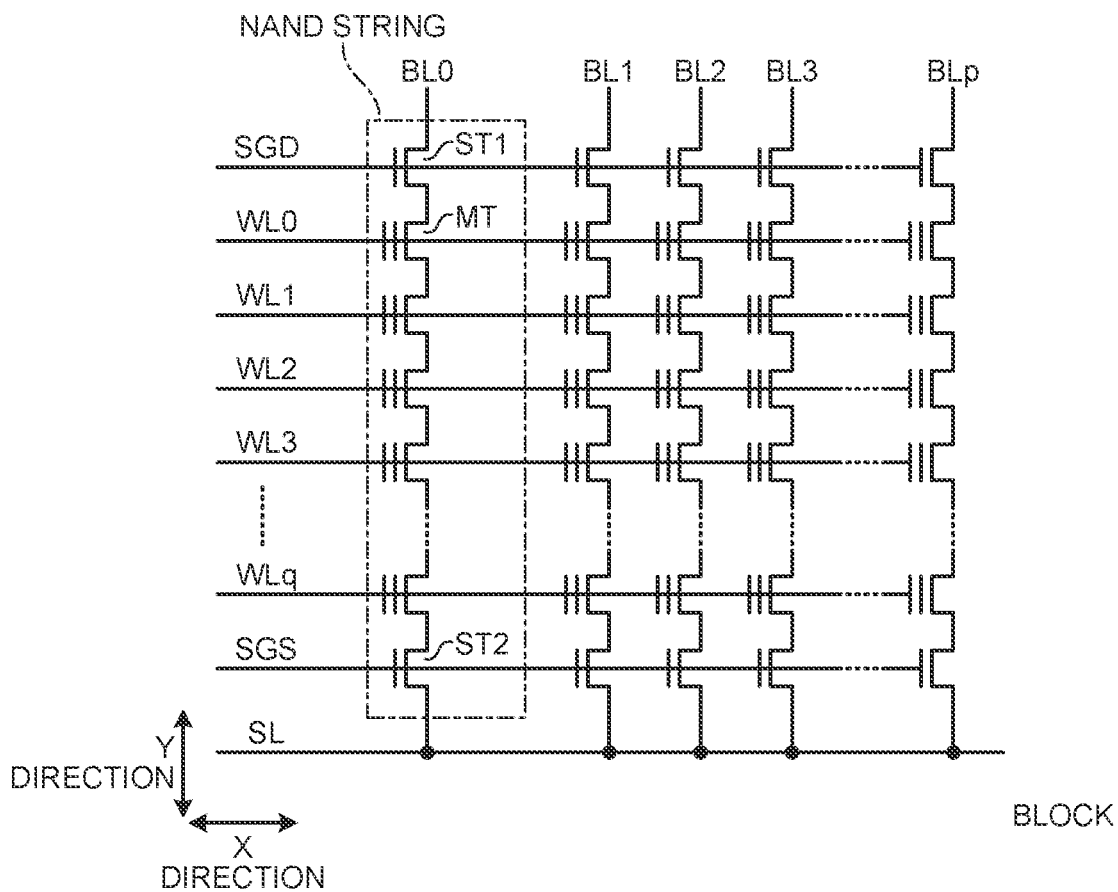
FIG. 3 is a circuit diagram illustrating an exemplary configuration of one block which is included in a memory cell array.

FIG. 3 is a circuit diagram illustrating an exemplary configuration of one block included in the memory cell array 16. As illustrated in the drawing, each block includes (q+1) NAND strings which are arranged in an order along an X direction (q is an integer of 0 or more). A select transistor ST1 included in each of the (q+1) NAND strings is configured such that the drain is connected to bit lines BL0 to BLp and the gate is commonly connected to a select gate line SGD. In addition, a select transistor ST2 is configured such that the source is commonly connected to a source line SL and the gate is commonly connected to a select gate line SGS.

Each memory cell transistor MT is composed of a metal oxide semiconductor field effect transistor (MOSFET)

which has a stacked gate structure formed on a semiconductor substrate. The stacked gate structure includes a charge accumulation layer (a floating gate) formed through a tunnel oxide film on the semiconductor substrate and a control gate electrode formed through an inter-gate insulating film on the charge accumulation layer. A threshold voltage of the memory cell transistor MT is changed according to the number of electrons accumulated in the floating gate, and data is stored according to a difference of the threshold voltage. In other words, the memory cell transistor MT holds the electric charges in the floating gate according to the data.

Specifically, the memory cell transistor MT is charged with the electrons by a peripheral circuit (not illustrated) provided in the NAND memory 11, so that the threshold voltage reaches a target value according to the data. The peripheral circuit includes a charge pump, a row decoder, a sense amplifier, and a column decoder. The memory cell transistor MT may be configured to store data of 1 bit therein, or may be configured to store multi-valued data (data of two or more bits) therein.

In each NAND string, the (q+1) memory cell transistors MT are disposed such that the respective current paths are connected in serial between the source of the select transistor ST1 and the drain of the select transistor ST2. Then, the control gate electrodes each are connected to word lines WL0 to WLq in an order from the memory cell transistor MT located closest to the drain. Therefore, the drain of the memory cell transistor MT connected to the word line WL0 is connected to the source of the select transistor ST1, and the source of the memory cell transistor MT connected to the word line WLq is connected to the drain of the select transistor ST2.

The word lines WL0 to WLq are commonly connected to the control gate electrodes of the memory cell transistors MT between the NAND strings in the block. In other words, the control gate electrodes of the memory cell transistors MT disposed on the same row in the block are connected to the same word line WL. The (p+1) memory cell transistors MT connected to the same word line WL is handled as one page, and data programming and data reading are performed at each page.

For example, according to a storage system in which data of two bits is stored in one memory cell transistor MT, any one of 4-valued data "xy" which is defined by upper page data "x" and lower page data "y" can be held in each memory cell transistor MT. For example, data "11", "01", "00", and "10" are assigned to the 4-valued data "xy" in an order of the electric charges accumulated in the floating gate. The data "11" means an erased state. The method for assigning the respective data to the electric charges is not limited to the above example. Any method may be employed as long as the respective data is associated to the electric charges to make a Hamming distance between neighboring data become "1".

The peripheral circuit applies a readout voltage to the word line WL in a read operation in order to specify the data ("11", "01", "00", and "10") stored in the memory cell transistor MT.

Figure 4:
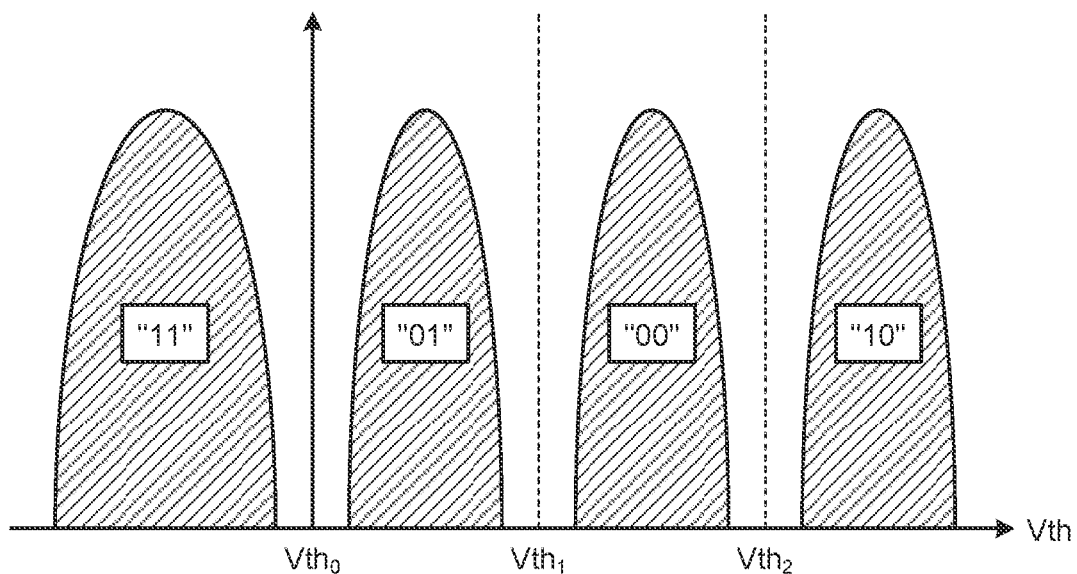
FIG. 4 is a diagram illustrating a relation between a distribution of electric charges and a readout voltage.

FIG. 4 is a diagram illustrating a relation between a distribution of the electric charges and the readout voltage. The horizontal axis represents the threshold voltage according to the electric charges. As illustrated in the drawing, the electric charges assigned to the respective data each are actually distributed within a range of a certain width. The range to which the electric charges held in the memory cell transistor MT belong is determined based on a comparison of the readout voltage and the threshold voltage which are set between the respective ranges. For example, the peripheral circuit determines whether the upper page data is "1" or "0" based on whether the threshold voltage of the memory cell transistor MT is present in a range from a readout voltage Vth0 to a readout voltage Vth2. In a case where the threshold voltage of the memory cell transistor MT is present in the range from the readout voltage Vth0 to the readout voltage Vth2, the peripheral circuit determines that the upper page data is "0". In a case where the threshold voltage of the memory cell transistor MT is not present in the range from the readout voltage Vth0 to the readout voltage Vth2, the peripheral circuit determines that the upper page data is "1". In addition, the peripheral circuit determines whether the lower page data is "1" or "0" based on whether the threshold voltage of the memory cell transistor MT is larger or smaller than a readout voltage Vth1. In a case where the threshold voltage of the memory cell transistor MT is larger than the readout voltage Vth1, the peripheral circuit determines that the lower page data is "0". In a case where the threshold voltage of the memory cell transistor MT is smaller than the readout voltage Vth1, the peripheral circuit determines that the lower page data is "1".

Each range of the electric charges assigned in each data is changed with time and in response to being accessed. Therefore, the data written in the memory cell array 16 may be read as a wrong value. The NAND memory 11 is configured to be changeable in the readout voltages Vth0 to Vth2 in order to cope with a change of data.

The memory controller 10 performs control on the entire operation of the memory system 1 including data transmission between the host 2 and the NAND memory 11. The memory controller 10 includes an interface (I/F) unit 12, a first processing unit 13, a NAND control unit 14, and a memory unit 15. Some or all of the interface (I/F) unit 12, the first processing unit 13, and the NAND control unit 14 may be realized by software, hardware, or a combination thereof. The realization of the components using the software means that a central processing unit (CPU) realizes the functions of the components based on a program in a computer. The computer includes the CPU and a memory storing the program previously therein.

The I/F unit 12 is a circuit configured to perform communication control between the host 2 and the memory controller 10. The I/F unit 12 transmits the access request from the host 2 to the NAND control unit 14, and configuring an operation of the memory controller 10 in response to a configuration request from the host 2.

The NAND control unit 14 makes access to the NAND memory 11 in response to the access request received from the I/F unit 12. Specifically, the NAND control unit 14 writes the data in response to the write request to the NAND memory 11. The NAND control unit 14 reads the data in response to the read request from the NAND memory 11.

The first processing unit 13 may be a circuit such as a CPU, an FPGA (field-programmable gate array), or an ASIC (application specific integrated circuit). The first processing unit 13 serves to perform the error correction function in the memory system 1 while a second processing unit 24 described below serves to perform the error correction function in the host 2. The first processing unit 13 appends error correction code to the data to be written in the NAND memory 11. In addition, the first processing unit 13 performs an error detection and error correction on the data read from the NAND memory 11 based on the error correction code.

Furthermore, the first processing unit 13 can perform a plurality of modes of the error correction each having correction capability different respectively. The first processing unit 13 appends, to the data, the error correction code for enabling the error correction in any mode. For example, the first processing unit 13 is configured to perform the error correction in modes of levels 1 to 4. The correction capability of the error correction in the mode of the level 1 is the lowest. The higher the level is, the higher the correction capability of the error correction becomes. The scheme of the error correction in the respective modes is as follows. Further, the error correction in the mode of level x will be denoted by a level-x correction.

A level-1 correction, for example, is a correction using a BCH code. The first processing unit 13 splits write target data into multiple partial data with a predetermined size, and a frame (a first frame) of the level-1 correction is generated using each partial data generated by the splitting. The size of the first frame may be the same as that of the page, or may be different therefrom. For example, the size of the first frame may be smaller than the size of the page. The NAND control unit 14 writes each generated first frame to the NAND memory 11. Each first frame includes one partial data and an error correction code calculated from the one partial data. The first processing unit 13 performs the level-1 correction in a unit of first frame.

In a level-2 correction, for example, the first processing unit 13 performs a read operation plural times while changing each of the readout voltages Vth0 to Vth2 until the error correction using the BCH code succeeds. As described above, a variation of the range of the electric charges assigned to each data causes an error in the data in the memory cell array 16. The number of error bits is reduced by setting the readout voltages Vth0 to Vth2 to more appropriate voltages, and as a result, a success rate of the correction is improved. Any method of changing the readout voltages Vth0 to Vth2 can be employed. According to the level-2 correction, since the read operation is performed plural times while the readout voltages Vth0 to Vth2 are changed, a time period taken for the level-2 correction is longer than a time period taken for the level-1 correction.

A level-3 correction, for example, is error correction which is performed using a plurality of data. FIG. 5 is a diagram illustrating an exemplary configuration of a frame for the level-3 correction. According to this example, the first processing unit 13 uses a plurality (herein, "4") of first frames as one frame group. The first processing unit 13 structures a frame (a second frame) for the level-3 correction using four first frames belonging to the one frame group. For example, the i-th bit from the head of the one first frame forms the i-th second frame together with the i-th bits from the heads of the other three first frames. As the error correction code for the level-3 correction, for example, an RS code may be employed. The error correction code for each second frame is stored at a predetermined location in the NAND memory 11. The error correction code of the second frame may be stored in the second frame.

In the level-3 correction, the first processing unit 13 reads not only one first frame included in the read target data but also three first frames belonging to the same frame group as the one first frame. Then, the error correction is performed on the second frame for each error bit contained in the one first frame included in the read target data.

Further, a combination of four first frames belonging to one frame group may be defined by any method. For example, each of four first frames included in one frame group belongs to a block different respectively. Furthermore, for example, in a case where the NAND memory 11 is composed of a plurality of memory chips each connected to a channel different respectively, one frame group may be composed of a plurality of first frames each belonging to a memory chip different respectively. Alternatively, in a case where the memory cell array 16 is configured to be divided into districts which can be operated in parallel, one frame group may be composed of a plurality of first frames each belonging to a district different respectively. According to the level-3 correction, since the plurality of first frames need to be read, a time taken for the level-3 correction is longer than the time taken for the level-1 correction and also the time taken for the level-2 correction.

An example of the error correction of a level-4 mode (a level-4 correction) will be described. In the level-4 correction, the first processing unit 13 sequentially corrects one or more error bits contained in the frame group by repeatedly performing the error correction for each of the first frames and the error correction for each of the second frames. In other words, in the level-4 correction, the first processing unit 13 configures a product code by using the error correction for each of the first frames and the error correction for each of the second frames, and repeatedly performs the correction. According to the level-4 correction, since the error correction for each of the first frames and the error correction for each of the second frames are repeatedly performed, a time taken for the level-4 correction is longer than the time for taken for the level-3 correction.

The memory unit 15 is composed of a register or a memory. In the memory unit 15, a first list 101 and first setting information 102 are stored. As the memory unit 15, any kind of memory may be employed. For example, a dynamic random access memory (DRAM) or a static random access memory (SRAM) may be employed.

FIG. 6 is a diagram illustrating an exemplary configuration of data of the first list 101. The first list 101 is a list of modes of the error correction which can be performed by the memory system 1. In the first list 101, a correction capability and a time (a correction time) taken for the correction for each mode are described. As the correction capability described in the first list 101, any index may be employed as long as the index can be used for comparison with other modes. For example, a maximum number of bits which can be subjected to the error correction in a predetermined size of data may be employed as the index of the correction capability. In addition, as the correction time described in the first list 101, any index may be employed as long as the index can be used for comparison with other modes. For example, the worst value of a time taken for the correction of a predetermined number of bit errors may be employed as the index of the correction time. Alternatively, an average value of the time taken for the correction of the predetermined number of bit errors may be employed as the index of the correction time.

FIG. 7 is a diagram illustrating an exemplary configuration of data of the first setting information 102. The first setting information 102 is information in which the execution is set to be enabled or disabled for each of the error correction of a plurality of modes described in the first list 101. In the example of FIG. 7, "Enabled" indicates that the execution is enabled, and "Disabled" indicates that the execution is disabled. In other words, the level-1 correction and the level-2 correction are enabled, and the level-3 correction and the level-4 correction are disabled. "Enabled" and "Disabled" of the execution are set by the host 2 (specifically, a setting unit 23).

Figure 8:
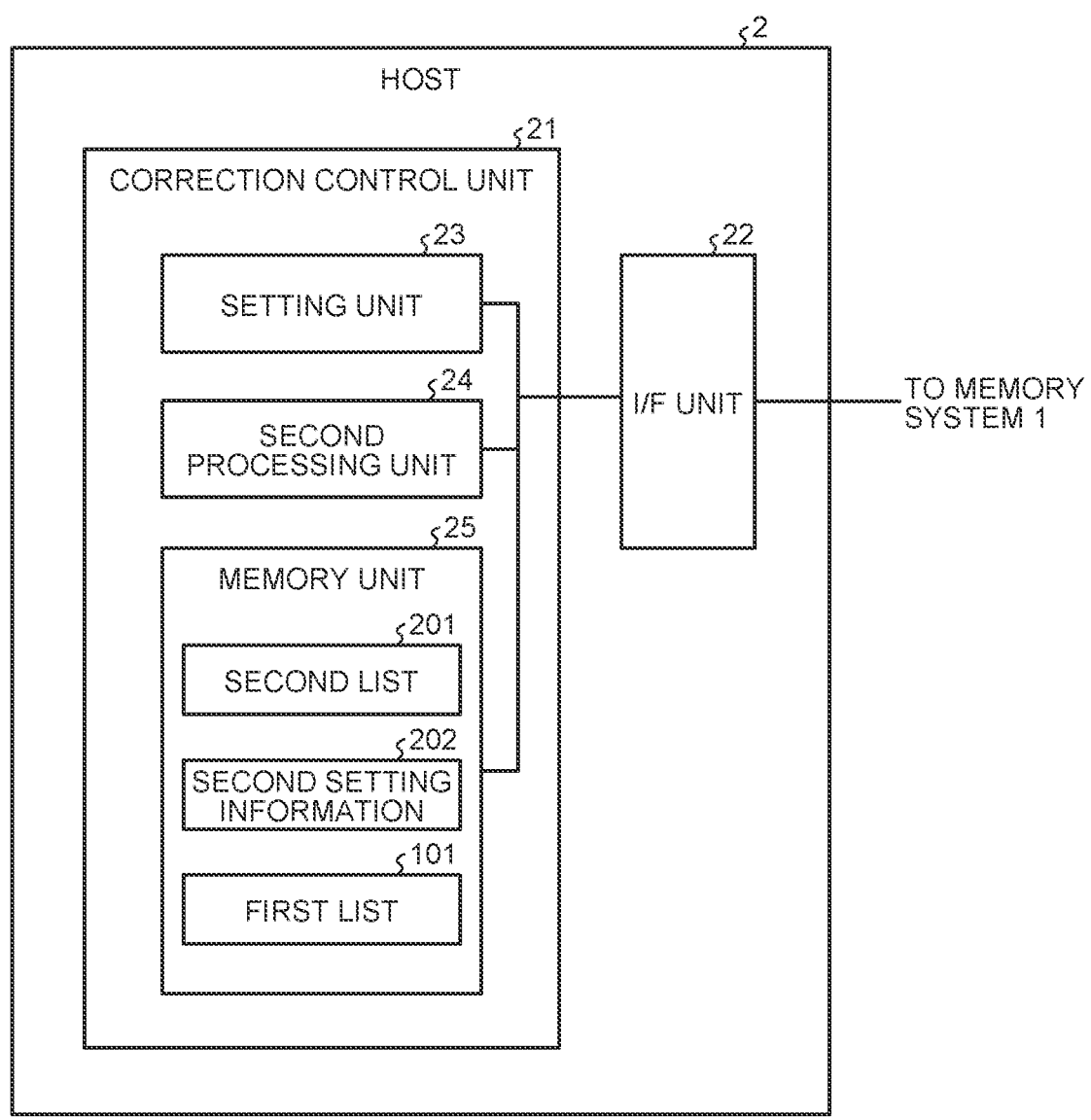
FIG. 8 is a diagram illustrating an exemplary configuration of a host.

FIG. 8 is a diagram illustrating an exemplary configuration of the host 2. The host 2 includes a correction control unit 21 and an I/F unit 22. The explanation of the configuration for issuing the access request will not be given.

The I/F unit 22 performs communication control between the memory system 1 and the host 2. The correction control unit 21 performs control on the correction of data. Specifically, the correction control unit 21 includes the setting unit 23, the second processing unit 24, and a memory unit 25. A part or all of the setting unit 23 and the second processing unit 24 may be realized by software, hardware, or a combination thereof. The memory unit 25 is configured by a register or a memory.

The second processing unit 24 can perform the error correction of one or more modes. For example, the second processing unit 24 structures redundant arrays of inexpensive disks (RAID) using the plurality of memory systems 1, and performs the error correction based on the RAID. As a scheme for the error correction, RAID 1, RAID 5, RAID 6, RAID 10, RAID 01, or a combination thereof can be employed. In addition, for example, the error correction scheme such as RAID 5 or RAID 6 may be installed by combination with a striping technology for an improvement in speed. In addition, the second processing unit 24 may perform the error correction using the error correction code.

The memory unit 25 is composed of the register or the memory. In the memory unit 25, a second list 201, second setting information 202, and the first list 101 are stored. As the memory unit 25, any kind of memory may be employed. For example, a dynamic random access memory (DRAM) or a static random access memory (SRAM) may be employed. The first list 101 is acquired from one memory system 1, and stored in the memory unit 25. In a case where the plurality of memory systems 1 constituting the information processing system 1000 are configured differently in modes of the error correction function, the memory unit 25 may be configured to store the multiple first lists 101 acquired from the memory systems 1.

Figure 9:
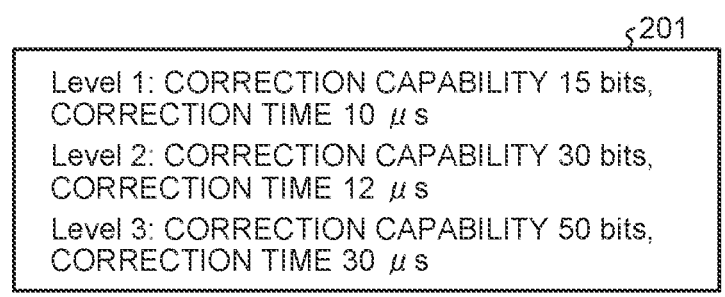
FIG. 9 is a diagram illustrating an exemplary configuration of data of a second list.

FIG. 9 is a diagram illustrating an exemplary configuration of data of the second list 201. The second list 201 is a list of modes of the error correction which can be performed by the host 2. In the second list 201, similarly to the first list 101, the correction capability and the time (the correction time) taken for the correction for each mode are described.

Figure 10:
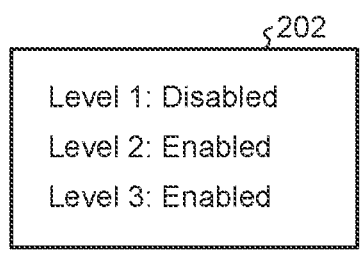
FIG. 10 is a diagram illustrating an exemplary configuration of data of second setting information.

FIG. 10 is a diagram illustrating an exemplary configuration of data of the second setting information 202. The second setting information 202 is information to enable or disable the execution for each of the error correction in a plurality of modes described in the second list 201. In the example of FIG. 10, "Enabled" indicates that the execution is enabled, and "Disabled" indicates that the execution is disabled. In other words, according to the example of FIG. 10, the level-1 correction is not enabled, and the level-2 correction and the level-3 correction are enabled. "Enabled" and "Disabled" of the execution are set by the setting unit 23.

The setting unit 23 acquires the first list 101. Then, the setting unit 23 specifies an unnecessary mode based on the first list 101 and the second list 201. The setting unit 23 generates the first setting information 102 and the second setting information 202 based on the specification result. Specifically, the setting unit 23 generates the first setting information 102 in which "Disabled" is recorded on an unnecessary mode and "Enabled" is recoded on a necessary mode among the plurality of modes which can be performed in the memory system 1. In addition, the setting unit 23 generates the second setting information 202 in which "Disabled" is recorded on an unnecessary mode and "Enabled" is recorded on a necessary mode among the plurality of modes which can be performed in the host 2. The setting unit 23 transmits the first setting information 102 to the I/F unit 22, and the I/F unit 22 transmits the first setting information 102 to the target memory system 1.

The unnecessary mode may be specified by any scheme. For example, the setting unit 23 focuses on one of the plurality of modes described in the first list 101 (a first focused mode). Then, the setting unit 23 focuses on one of the plurality of modes described in the second list 201 (a second focused mode). Then, the setting unit 23 compares the first focused mode with the second focused mode about the correction capability and the correction time. In a case where the correction capability in one of the first and second focused modes is equal to or lower than the correction capability of the other one and the correction time of the error correction in the one mode is larger than the other mode, the setting unit 23 determines the one mode as the unnecessary mode. In addition, in a case where the correction capability in the one mode is lower than the correction capability in the other mode and the correction time of the error correction in the one mode is equal to or larger than the other mode, the setting unit 23 determines the one mode as the unnecessary mode. The setting unit 23 performs the above comparison on all the combinations between the entire modes described in the first list 101 and the entire modes described in the second list 201.

An example of the determination of the setting unit 23 will be described according to the example of the first list 101 illustrated in FIG. 6 and the example of the second list 201 illustrated in FIG. 9. The level-4 correction which can be performed in the memory system 1 has a lower correction capability than the level-3 correction which can be performed in the host 2 and the same correction time as the level-3 correction in the host 2. Therefore, the setting unit 23 determines that the level-4 correction in the memory system 1 is unnecessary. In addition, the level-3 correction which can be performed in the memory system 1 has the same correction capability as the level-2 correction which can be performed in the host 2 and a larger correction time than the level-2 correction in the host 2. Therefore, the setting unit 23 determines that the level-3 correction in the memory system 1 is unnecessary. In addition, the level-1 correction which can be performed in the host 2 has a lower correction capability than the level-2 correction which can be performed in the memory system 1 and the same correction time as the level-2 correction in the memory system 1. Therefore, the setting unit 23 determines that the level-1 correction in the host 2 is unnecessary.

Further, in a case where the correction capability of one of the first focused mode and the second focused mode is higher than that of the other mode and the correction time of the one mode is larger than that of the other mode, the setting unit 23 makes determination based on a predetermined algorithm. For example, the setting unit 23 calculates an evaluation value of each of the first focused mode and the second focused mode based on a predetermined function which has the correction capability and the correction time as parameters, and determines the unnecessary mode based on the comparison between the calculated evaluation values of the respective focused modes. As the evaluation value, for example, a value obtained by dividing the correction capability by the correction time (the number of error bits which can be corrected per unit time) may be employed.

In addition, in a case where the correction capability of one of the first focused mode and the second focused mode is higher than that of the other mode and the correction time of the one mode is larger than that of the other mode, the setting unit 23 may be configured to determine that neither mode is unnecessary.

Next, an operation of the information processing system 1000 of the first embodiment will be described.

Figure 11:
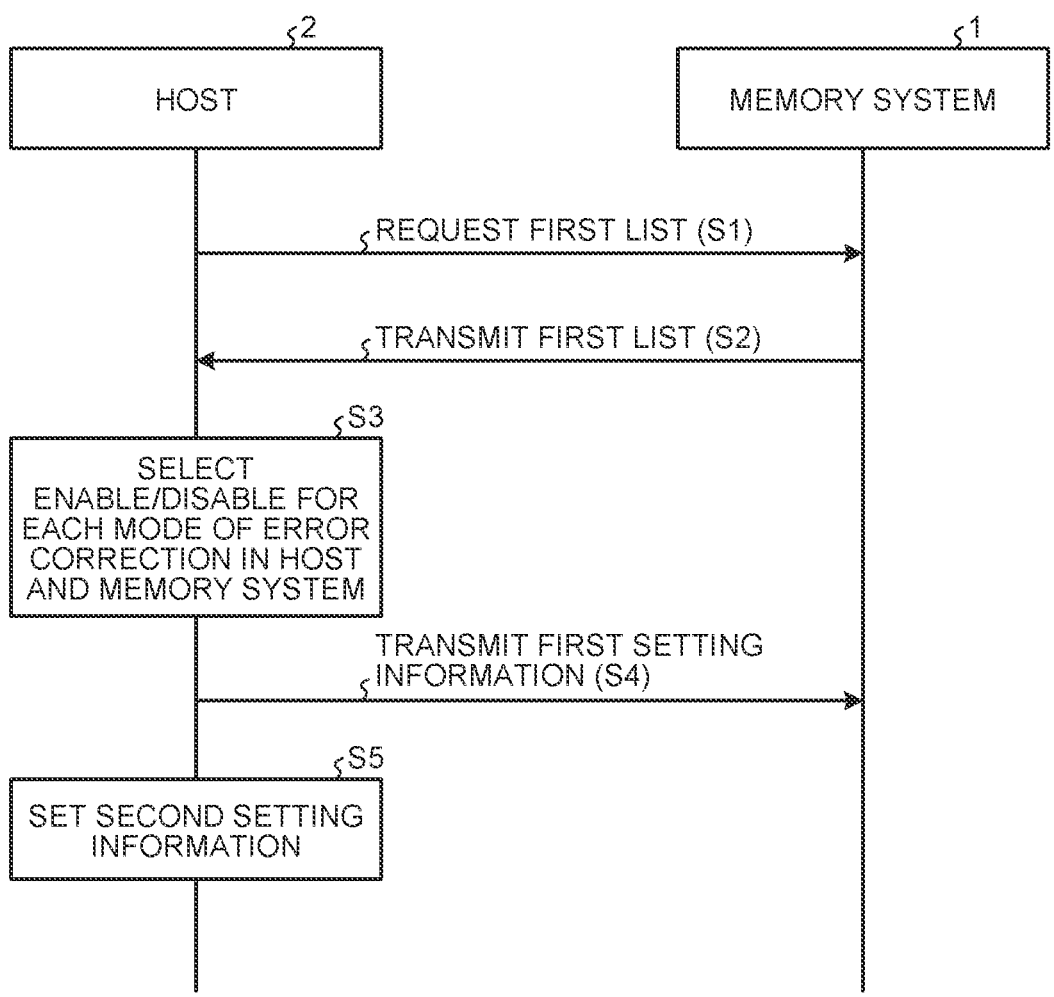
FIG. 11 is a sequence diagram for describing a setting process of the first embodiment.

FIG. 11 is a sequence diagram for describing an operation (a setting process) of setting the first setting information 102 and the second setting information 202. First, in the host 2, the setting unit 23 generates a request for the first list 101 to the memory system 1 (S1). The request is transmitted to the memory system 1 through the I/F unit 22. In the memory system 1, when the I/F unit 12 receives the request in S1, the I/F unit 12 reads the first list 101 from the memory unit 15, and transmits the read first list 101 to the host 2 (S2). In the host 2, when the I/F unit 22 receives the first list 101, the I/F unit 22 stores the received first list 101 in the memory unit 25.

Subsequently, in the host 2, the setting unit 23 determines the unnecessary modes based on the first list 101 and the second list 201, and generates the first setting information 102 and the second setting information 202 based on the determination result (S3). The setting unit 23 transmits the first setting information 102 to the I/F unit 22, and the I/F unit 22 transmits the first setting information 102 to the memory system 1 (S4). In the memory system 1, the I/F unit 12 stores the received first setting information 102 in the memory unit 15. In the host 2, the setting unit 23 stores the generated second setting information 202 in the memory unit 25 (S5).

A setting process illustrated in FIG. 11 is performed at a predetermined timing. For example, a setting process is performed at the time when the information processing system 1000 is started up. A setting process may be performed at the time of the start-up, or may be performed only once at the first start-up. In addition, a setting process may be performed at any timing during the operation of the information processing system 1000.

Figure 12:
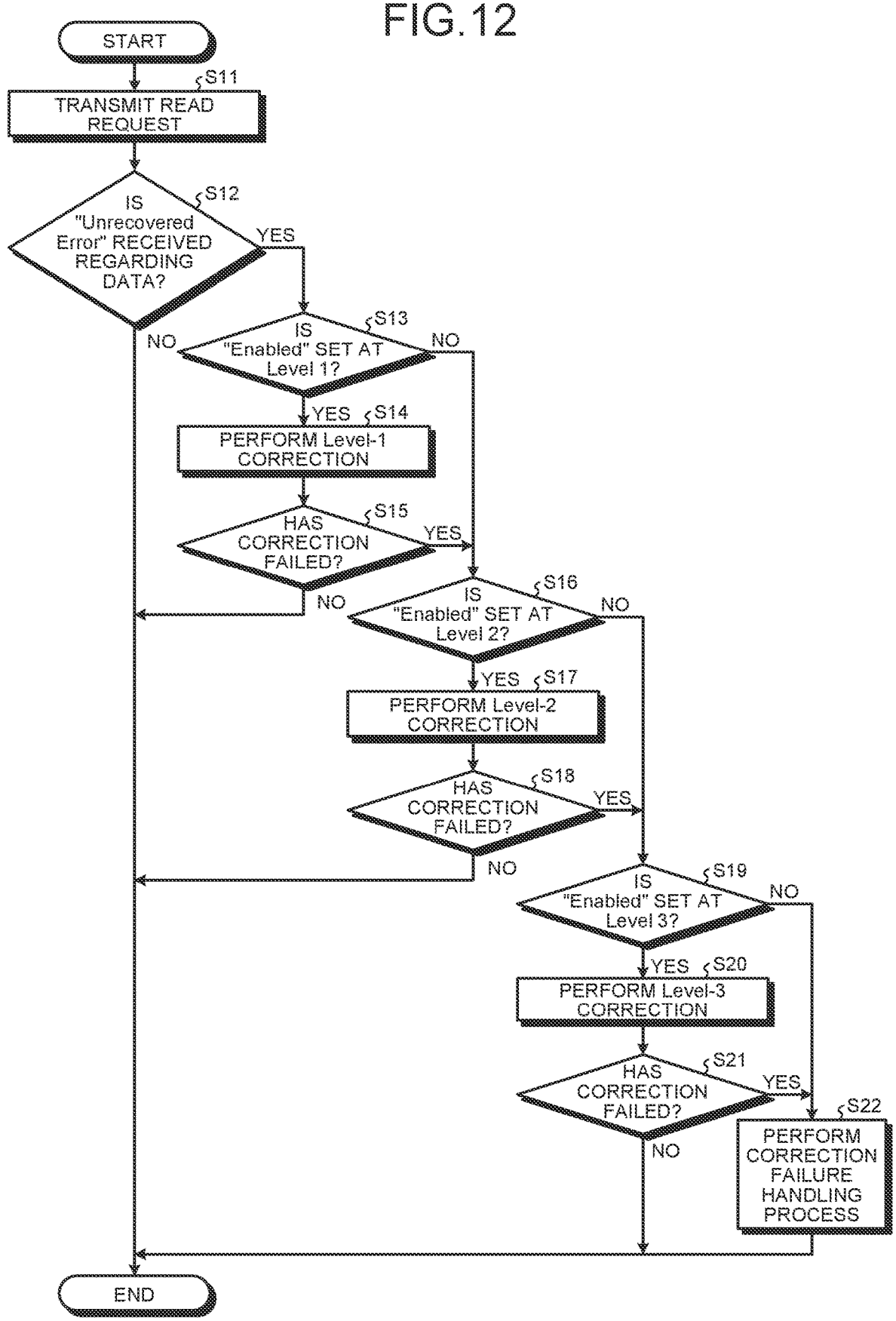
FIG. 12 is a flowchart for describing an operation of the host when a read operation is performed on the memory system.

FIG. 12 is a flowchart for describing an operation of the host 2 when a read operation is performed on the memory system 1. The host 2 first transmits the read request to the memory system 1 (S11). The read request is generated by a CPU (not illustrated) in the host 2, and transmitted to the memory system 1 by the I/F unit 22. When the memory system 1 receives the read request, the memory system 1 performs an operation in response to the received read request.

Figure 13:
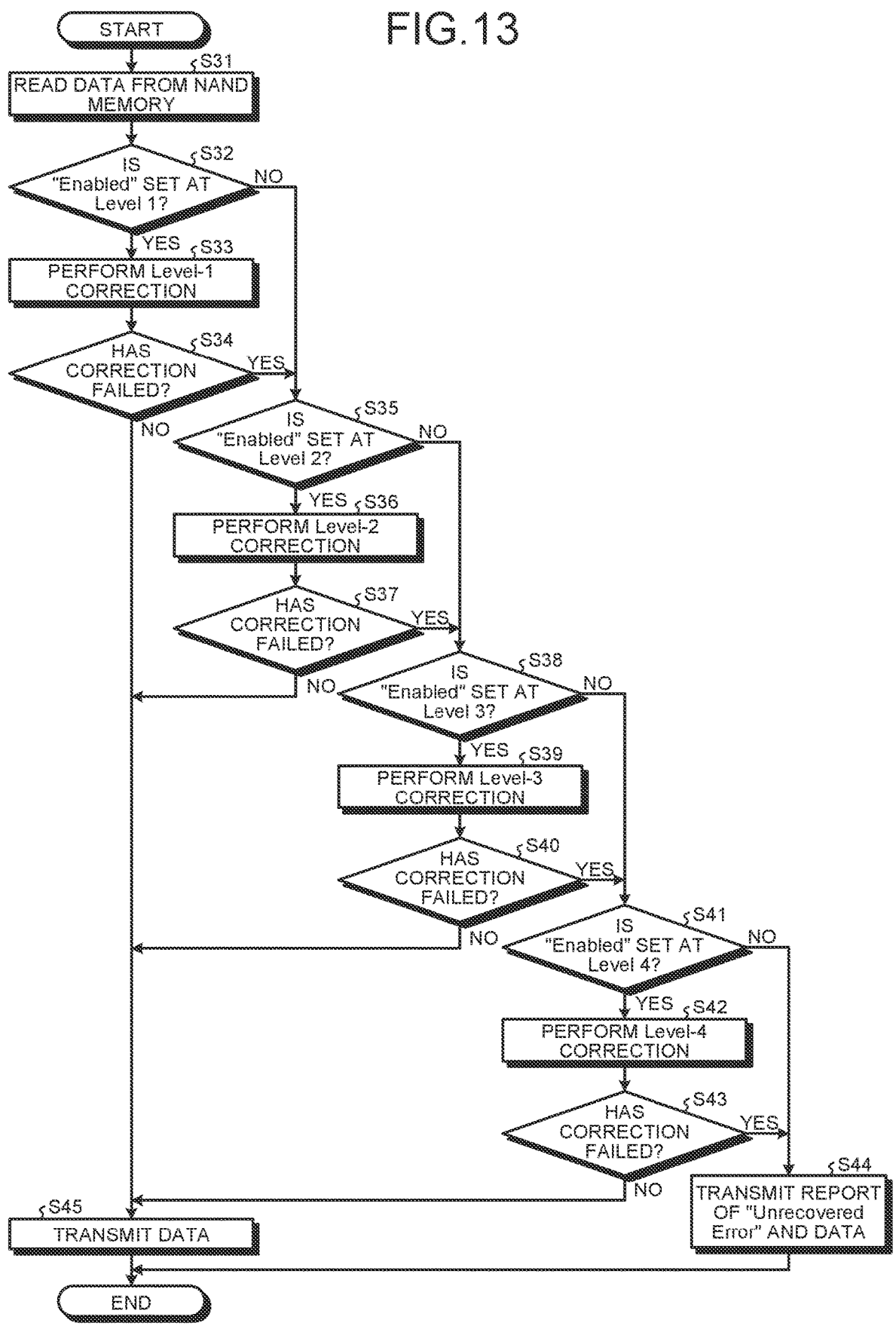
FIG. 13 is a flowchart for describing an operation of the memory system when a read request is received.

FIG. 13 is a flowchart for describing an operation of the memory system 1 at the time when the memory system 1 receives the read request. In the memory system 1, the read request is received by the I/F unit 12. The I/F unit 12 transmits the received read request to the NAND control unit 14. The NAND control unit 14 reads the read target data of the read request from the NAND memory 11 (S31).

Subsequently, the first processing unit 13 determines whether the level-1 correction is set to "Enabled" with reference to the first setting information 102 (S32). In a case where the level-1 correction is set to "Enabled" (Yes in S32), the first processing unit 13 performs the level-1 correction (S33). Subsequently, the first processing unit 13 determines whether the level-1 correction is failed (S34). The failing of the correction means that one or more error bits are left without being corrected.

In a case where the level-1 correction is not set to "Enabled" (No in S32) or a case where the level-1 correction is failed (Yes in S34), the first processing unit 13 determines whether the level-2 correction is set to "Enabled" with reference to the first setting information 102 (S35). In a case where the level-2 correction is set to "Enabled" (Yes in S35), the first processing unit 13 performs the level-2 correction (S36). The first processing unit 13 determines whether the level-2 correction is failed (S37).

In a case where the level-2 correction is not set to "Enabled" (No in S35) or a case where the level-2 correction is failed (Yes in S37), the first processing unit 13 determines whether the level-3 correction is set to "Enabled" with reference to the first setting information 102 (S38). In a case where the level-3 correction is set to "Enabled" (Yes in S38), the first processing unit 13 performs the level-3 correction (S39). The first processing unit 13 determines whether the level-3 correction is failed (S40).

In a case where the level-3 correction is not set to "Enabled" (No in S38) or a case where the level-3 correction is failed (Yes in S40), the first processing unit 13 determines whether the level-4 correction is set to "Enabled" with reference to the first setting information 102 (S41). In a case where the level-4 correction is set to "Enabled" (Yes in S41), the first processing unit 13 performs the level-4 correction (S42). The first processing unit 13 determines whether the level-4 correction is failed (S43).

In a case where the level-4 correction is not set to "Enabled" (No in S41) or a case where the level-4 correction is failed (Yes in S43), the first processing unit 13 transmits a report "Unrecovered Error" indicating the failure of the error correction in the memory system 1 together with the data failed in the error correction to the I/F unit 12, and the I/F unit 12 transmits the data and the report to the host 2 (S44). Further, the data failed in the error correction is data which contains an error before the error correction is performed.

In a case where the level-1 correction is successful (No in S34), a case where the level-2 correction is successful (No in S37), a case where the level-3 correction is successful (No in S40), or a case where the level-4 correction is successful (No in S43), the I/F unit 12 transmits the corrected data to the host 2 (S45). After the process of S44, or after the process of S45, the memory system 1 ends the operation in response to the read request.

In the host 2, after the read request is transmitted, the I/F unit 22 waits for the reception of the data. In a case where the report "Unrecovered Error" is received together with the data (Yes in S12), the I/F unit 22 transmits the data and the report "Unrecovered Error" to the second processing unit 24. The second processing unit 24 determines whether the level-1 correction is set to "Enabled" with reference to the second setting information 202 (S13). In a case where the level-1 correction is set to "Enabled" (Yes in S13), the second processing unit 24 performs the level-1 correction on the data failed in the error correction in the memory system 1 (S14). The second processing unit 24 determines whether the level-1 correction is failed (S15).

In a case where the level-1 correction is not set to "Enabled" (No in S13) or a case the level-1 correction is failed (Yes in S15), the second processing unit 24 determines whether the level-2 correction is set to "Enabled" with reference to the second setting information 202 (S16). In a case where the level-2 correction is set to "Enabled" (Yes in S16), the second processing unit 24 performs the level-2 correction (S17). The second processing unit 24 determines whether the level-2 correction is failed (S18).

In a case where the level-2 correction is not set to "Enabled" (No in S16) or a case where the level-2 correction is failed (Yes in S18), the second processing unit 24 determines whether the level-3 correction is set to "Enabled" with reference to the second setting information 202 (S19). In a case where the level-3 correction is set to "Enabled" (Yes in S19), the second processing unit 24 performs the level-3 correction (S20). The second processing unit 24 determines whether the level-3 correction is failed (S21).

In a case where the data is received without the report "Unrecovered Error" (No in S12), a case where the level-1 correction is successful (No in S15), a case where the level-2 correction is successful (No in S18), or a case where the level-3 correction is successful (No in S21), the operation of the host 2 is ended.

In a case where the level-3 correction is not set to "Enabled" (No in S19) or a case where the level-3 correction is failed (Yes in S21), the host 2 performs an error process (S22), and the operation of the host 2 is ended. Further, any process may be applied to the processing content of the error process. For example, the host 2 displays the fact that the read is failed to a user as the error process.

Therefore, according to the first embodiment, the first processing unit 13 can perform the error correction of the plurality of modes. Then, the first processing unit 13 performs the error correction of one ore more modes among the plurality of modes in response to a request from the setting unit 23 in the host 2. With this configuration, in a case where the host 2 has the error correction function, the error correction can be efficiently performed all over the information processing system 1000.

In addition, the I/F unit 12 can transmit, in response to a request from the outside, the first list 101 to the outside as a list of the error correction functions. With this configuration, the setting unit 23 can set the error correction which can be performed in the memory system 1 to "Enabled" or "Disabled" after confirming the error correction which can be performed in the memory system 1.

In addition, in the first list 101, the correction capability and the correction time are described for each mode. With this configuration, the setting unit 23 can supply the correction capability and the correction time described in the first list 101 for the determination on "Enabled" or "Disabled". Further, in the first list 101, there may be description about only any one of the correction capability and the correction time. In addition, besides the correction capability and the correction time, any type of information may be described as the information described in the first list 101 as long as it can be used for the determination on setting of "Enabled" or "Disabled".

In addition, the explanation has been made about that the setting unit 23 transmits the first setting information 102 which is set to "Enabled" or "Disabled" for each mode in the process of S4. The setting unit 23 may designate only any one of the enabled mode or the disabled mode. In a case where only the enabled mode is designated, the first processing unit 13 performs the error correction of the mode which is designated as "Enabled", and does not perform the error correction of the mode which is not designated as "Enabled". In addition, in a case where only the disabled mode is designated, the first processing unit 13 performs the error correction of the mode which is not designated as "Disabled", and does not perform the error correction of the mode which is designated as "Disabled".

In addition, it is explained that, in a case where the error correction in the memory system 1 is failed, the first processing unit 13 transmits the data failed in the error correction to the host 2. The first processing unit 13 may do not transmit the data failed in the error correction, and the second processing unit 24 may recover the data by the RAID without using the data failed in the error correction. The recovery of the data by the RAID belongs to a concept of the error correction.

In addition, it is explained that the first processing unit 13 attaches the error correction code to enable the data to enable the error correction in any mode described in the first list 101. The first processing unit 13 may be configured to set and select the error correction code to be attached to the data. For example, the first processing unit 13 attaches only the error correction code necessary for the error correction of the mode set to "Enabled" in the first setting information 102 to the data to write. For example, in a case where the error correction code for the level-3 correction and the error correction code for the level-4 correction are set not to be used, the first processing unit 13 does not structure the second frame. In addition, for example, the first processing unit 13 may manage information to be set about whether the error correction code is attached, as information separately from the first setting information 102. In a case where the error correction code of the mode which is enabled to be performed is not attached, the first processing unit 13 treats the error correction of the mode as the one prohibited from being performed. Since it is possible to designate that the error correction code is not attached, the amount of redundant data to be written can be reduced.

In addition, the setting unit 23 in the host 2 sets, to the memory system 1, one or more modes of the error correction enabled to be performed among a plurality of modes of the error correction which can be performed in the memory system 1. Specifically, the setting unit 23 selects the one or more modes of the error correction enabled to be performed among the plurality of modes of the error correction which can be performed in the memory system 1, and sets the selected one or more modes to the memory system 1. In a case where the error correction which is enabled to be performed in the memory system 1 fails, the second processing unit 24 performs the error correction in the host 2.

Further, it is explained that, in a case where the second processing unit 24 fails in the error correction of all the modes enabled to be performed, the host 2 performs the error process. In a case where the second processing unit 24 fails in the error correction of all the modes enabled to be performed and a "Disabled" mode is stored in the first setting information 102, the correction control unit 21 may cause the memory system 1 to perform the error correction of the "Disabled" mode.

Second Embodiment

In a case where the SCSI standard is employed as the communication interface standard between the host 2 and each memory system 1, the I/F unit 22 can use an INQUIRY command in the process of S1. In a case where the INQUIRY command is used in the process of S1, the I/F unit 12 transmits the first list 101 as a response to the INQUIRY command in the process of S2.

FIG. 14 is a diagram illustrating an example of a response in a case where the SCSI standard is employed. A response 300 includes a 7-byte area 301 for each mode of the error correction. In each area 301, mode identification information (Level No.), the correction capability, and the correction time are described. Further, a 4-byte area in the head of the response 300 is used as a header area.

In addition, in a case where the SCSI standard is employed, the host 2 can use a ModePage as a method for setting a parameter to a device. The ModePage is one of input methods which are supplied by the device in conformity with the SCSI standard. Herein, as an example, it is assumed that the ModePage is provided in the memory unit 15. The I/F unit 22 sets a parameter to the ModePage by using a ModeSelect command in the process of S3.

FIG. 15 is a diagram illustrating an exemplary configuration of data of the first setting information 102 in a case where the SCSI standard is employed. The ModePage includes a plurality of page areas, each of which is identified by a page number. The ModePage includes a vendor unique page area in addition to the page area in which a unique parameter is set to the SCSI standard. For example, the first setting information 102 can be stored in the vendor unique page area. In the example of FIG. 15, the page area of which the page number as the vendor unique page area is "35h" is used as the first setting information 102. In the first setting information 102 of FIG. 15, four bits "D_Level1", "D_Level2", "D_Level3", and "D_Level4" are defined in the second byte from the head. Herein, "D_Levelx" is flag information indicating whether the level-x correction is enabled to be performed. Values indicating "Enabled" or "Disabled" are set in "D_Level1", "D_Level2", "D_Level3", and "D_Level4".

In addition, in a case where the SCSI standard is employed, the first processing unit 13 can transmit a CHECK CONDITION status. The CHECK CONDITION status is a report indicating that the execution of a command has failed. For example, the first processing unit 13 transmits a response frame containing the CHECK CONDITION status, and transmits sense data indicating "Unrecovered Error" following the response frame containing the CHECK CONDITION status. When the response frame containing the CHECK CONDITION status and the sense data are received, the host 2 recognizes that the memory system 1 has failed in the execution of the error correction.

In this way, in a case where the SCSI standard is applied, the host 2 can set the first setting information 102 to each memory system 1 by the ModeSelect command. In addition, the host 2 can acquire the first list 101 by the INQUIRY command. In addition, when the CHECK CONDITION status is received, the host 2 can recognize that the memory system 1 has failed in the execution of the error correction. Further, it is explained that the first processing unit 13 notifies Unrecovered Error using the sense data, but the notification method of Unrecovered Error is not limited thereto. For example, the first processing unit 13 may append information indicating Unrecovered Error to the response frame containing the CHECK CONDITION status.

Third Embodiment

In a third embodiment, the setting unit 23 transmits a condition to the memory system 1 as a method in which the host 2 (properly, the setting unit 23) sets the enabled mode of the error correction to the memory system 1. In the memory system 1, the first processing unit 13 selects a mode satisfying the condition received from the host 2 among the modes which can be performed in the first processing unit. The condition, for example, includes a limit value of time (a time limit). The setting unit 23, for example, selects the mode for the memory system 1 such that latency for the read request does not exceed the time limit.

Figure 16:
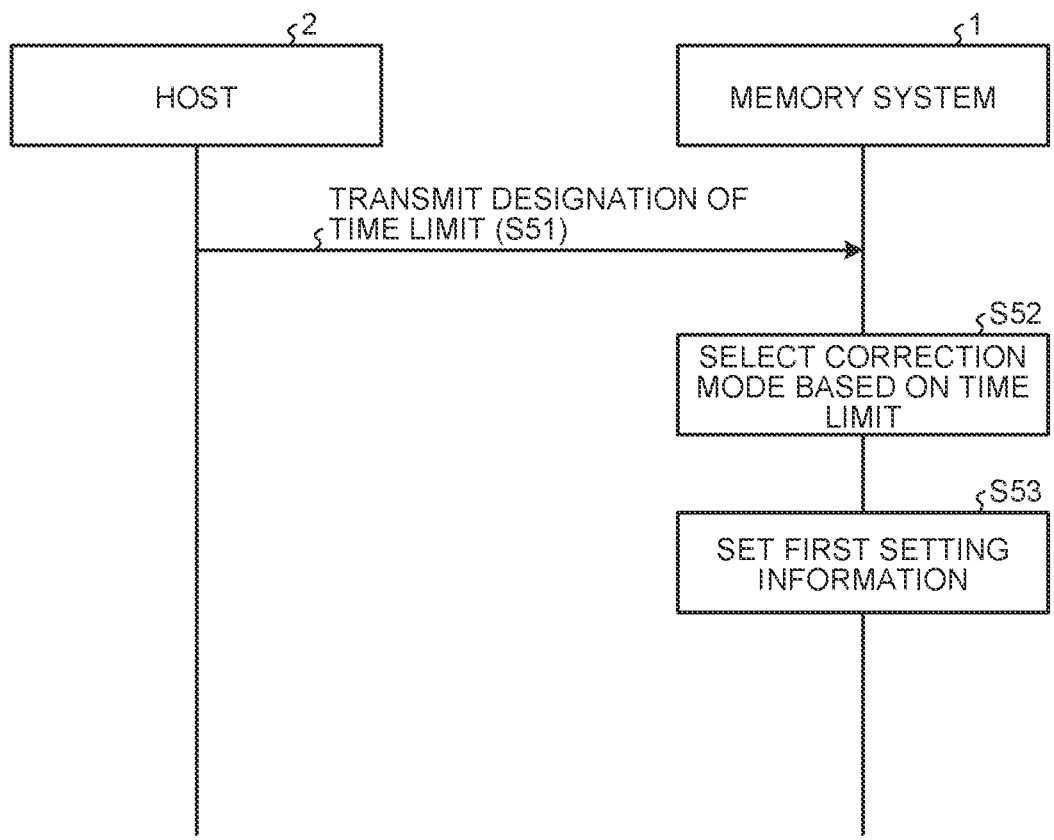
FIG. 16 is a sequence diagram for describing a setting process of a third embodiment.

FIG. 16 is a sequence diagram for describing a setting process of a third embodiment. In the host 2, the setting unit 23 transmits a designation of the time limit to the memory system 1 (S51). For example, in a case where the SCSI standard is employed as the communication interface standard between the host 2 and each memory system 1, the designation of the time limit can be realized by using an OCT timer.

In the memory system 1, when the designation of S51 is received, the I/F unit 12 transmits the received designation to the first processing unit 13. The first processing unit 13 selects one or more of four modes based on time limit (S52). Any method can be employed for selecting the modes based on the time limit. For example, the first processing unit 13 sequentially adds up the correction times from the level-1 correction in an order of level, and selects the mode such that the number of modes is maximized in a range where the added value does not exceed the time limit. After the process of S52, the first processing unit 13 stores the first setting information 102 in which the selected modes are set to "Enabled" and the unselected mode(s) are set to "Disabled" in the memory unit 15 (S53).

In this way, according to the third embodiment, the setting unit 23 can designate the condition. The first processing unit 13 selects the one or more modes from among the plurality of modes to satisfy the designated condition. Then, the first processing unit 13 performs the error correction of the selected modes, and does not perform the error correction of the unselected mode(s). With this configuration, there is no need for the setting unit 23 to directly designate the mode(s), and the error correction can be efficiently performed all over the information processing system 1000.

In addition, the setting unit 23 can designate the limit value of time as an example. With this configuration, the host 2 can limit the latency for the read request.

Fourth Embodiment

Figure 17:
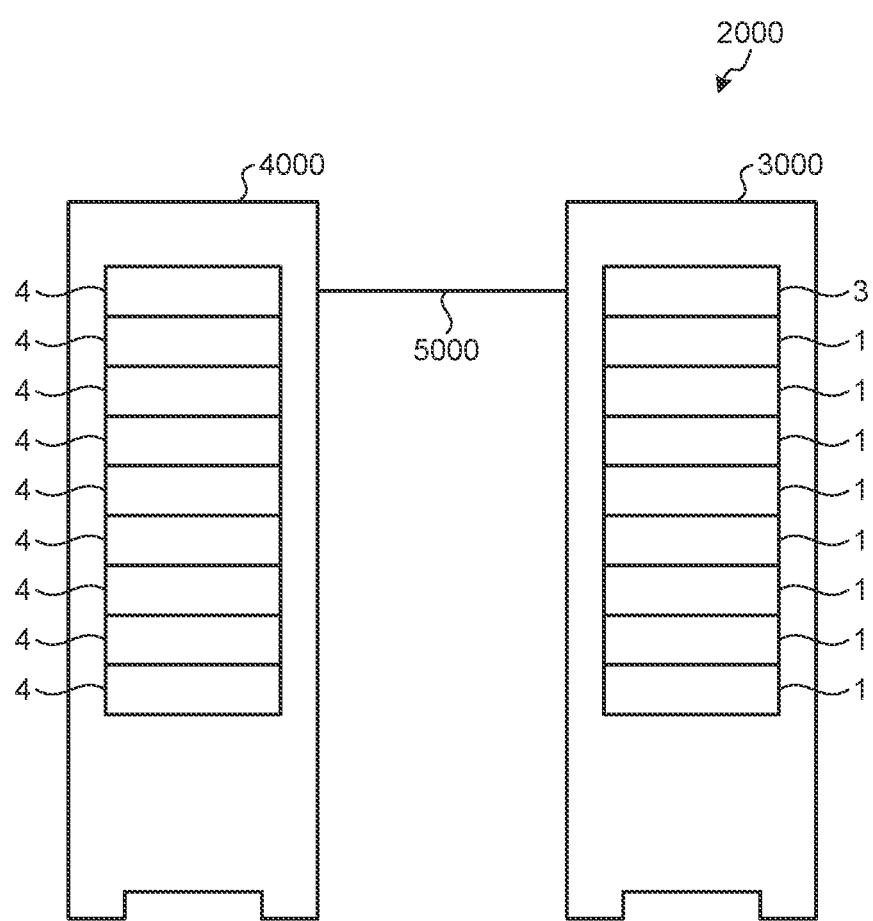
FIG. 17 is a diagram illustrating an exemplary installation of a fourth embodiment of the memory system.

FIG. 17 is a diagram illustrating an exemplary installation of a fourth embodiment of the memory system 1. The memory system 1, for example, is installed in a server system 2000 as the information processing system of the fourth embodiment. The server system 2000 is configured such that a disk array 3000 and a rack-mount server 4000 are connected by a connection line 5000. Any standard may be employed as a communication interface standard of the connection line 5000. The rack-mount server 4000 is configured such that one or more hosts 4 are mounted in a server rack. The plurality of hosts 4 can make access to the disk array 3000 through the connection line 5000. The plurality of hosts 4 can transmit the access request containing the read request to the disk array 3000.

In addition, the disk array 3000 is configured such that a RAID controller 3 and one or more memory systems 1 are mounted in the server rack. Each memory system 1 can perform the read request from each host 4.

Figure 18:
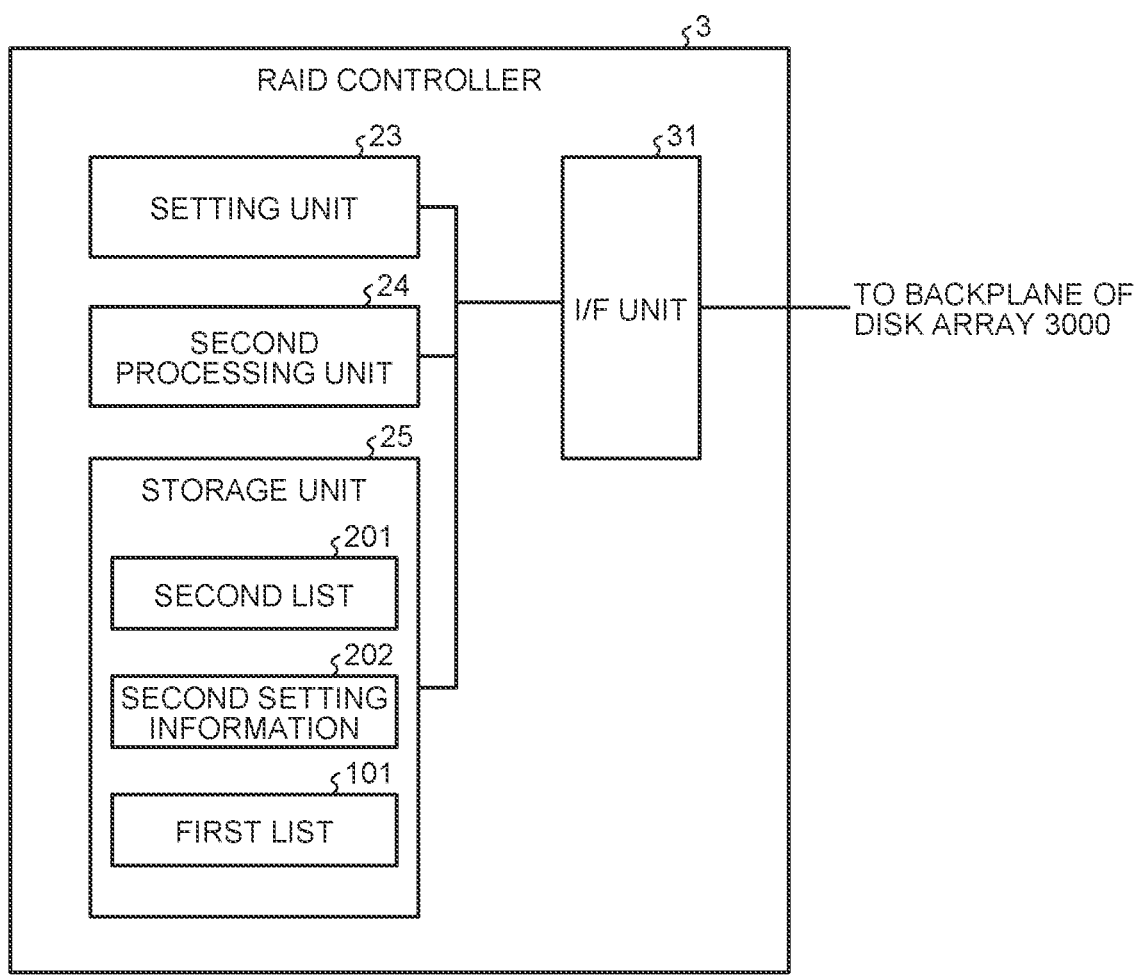
FIG. 18 is a diagram illustrating an exemplary configuration of a RAID controller.

The RAID controller 3 structures the redundant arrays of inexpensive disks (RAID) using the plurality of memory systems 1 provided in the server rack. The RAID controller 3 receives the read request (a first read request) from each host 4. The RAID controller 3 specifies one or more memory systems 1 which store the data requested by the received read request among the plurality of memory systems 1 which are mounted in the server rack. The RAID controller 3 transmits the read request (a second read request) to one or more specified memory systems 1. In addition, the RAID controller 3 performs the same operations as the correction control unit 21 of the first to third embodiments on each memory system 1. FIG. 18 is a diagram illustrating an exemplary configuration of the RAID controller 3. The same components as the first embodiment will be denoted with the same symbols and names, and the redundant descriptions will not be repeated.

The RAID controller 3 includes an I/F unit 31, a setting unit 23, a second processing unit 24, and a memory unit 25. The memory unit 25 stores the second list 201, the second setting information 202, and the first list 101. The I/F unit 31 is connected to each memory system 1 through a backplane of the server rack, and performs communication control between each memory system 1 and the RAID controller 3.

In a case where the memory system 1 at the destination of the second read request or the RAID controller 3 is successful in the error correction on the data requested by the first read request, the RAID controller 3 transmits the data after the error correction to the host 4 at a transmission source of the first read request.

Further, the RAID controller 3 has been described as a unit which is mounted in the server rack, but the RAID controller 3 may be installed in a form of a chip in the backplane of the server rack.

Fifth Embodiment

Figure 19:
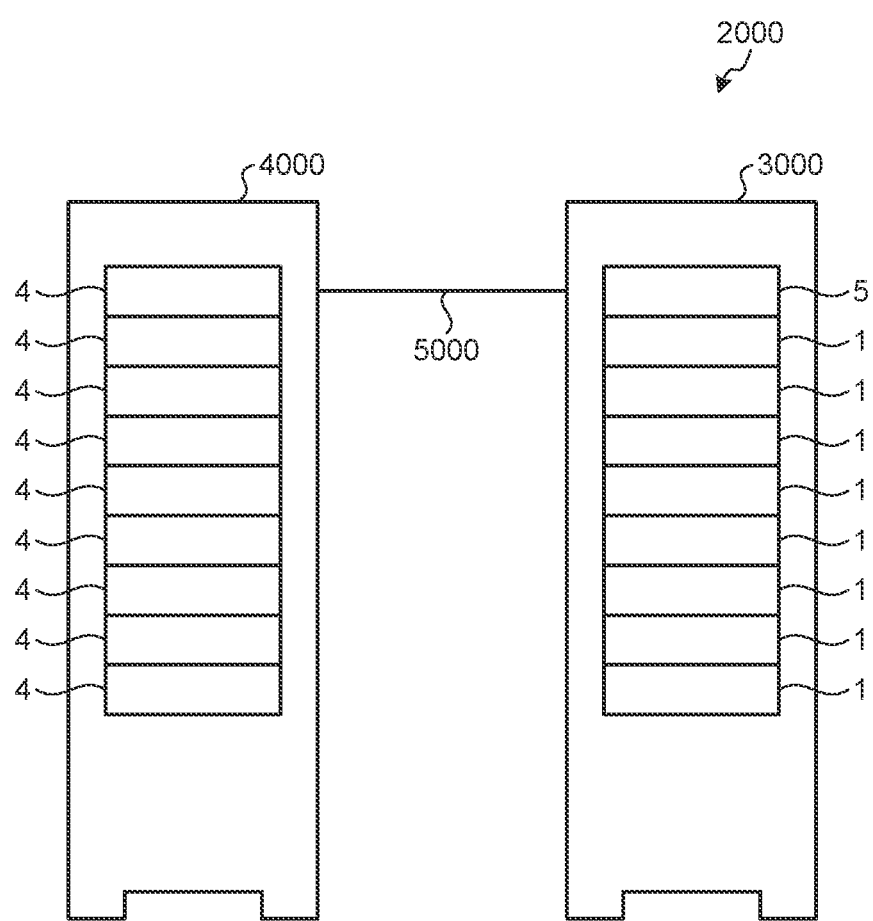
FIG. 19 is a diagram illustrating an exemplary installation of a fifth embodiment of the memory system.

FIG. 19 is a diagram illustrating an exemplary installation of a fifth embodiment of the memory system 1. The same components as those in the fourth embodiment will be denoted with the same names and the same symbols as those in the fourth embodiment. The descriptions of the same components as those in the fourth embodiment will not be repeated.

The server system 2000 as the information processing system of the fifth embodiment includes the disk array 3000 and the rack-mount server 4000. The disk array 3000 and the rack-mount server 4000 are connected to each other through the connection line 5000. The rack-mount server 4000 is configured such that one or more hosts 4 are mounted in the server rack. Each host 4 can transmit an access request containing the read request to the rack-mount server 4000.

The disk array 3000 is configured such that a storage controller 5 and one or more memory systems 1 are mounted in the server rack. The storage controller 5 receives the first read request from each host 4. The storage controller 5 specifies one or more memory systems 1 which store the data requested by the received first read request among the plurality of memory systems 1 mounted in the server rack. The storage controller 5 transmits the second read request to the specified one or more memory systems 1. Each memory system 1 performs the same operations as those of the first to third embodiments in response to the received second read request.

The storage controller 5 integrally controls the plurality of memory systems 1 provided in the disk array 3000. Specifically, the storage controller 5 performs the structuring of the RAID, the virtualization of the storage, and the mirroring of the storage using the plurality of memory systems 1 provided in the disk array 3000. In addition, the storage controller 5 performs the same operations as those of the correction control unit 21 of the first to third embodiments with respect to each memory system 1. In a case where the storage controller 5 or the memory system 1 at the destination of the second read request is successful in the error correction on the data requested by the first read request, the storage controller 5 transmits the data after the error correction to the host 4 at the transmission source of the first read request.

Figure 20:
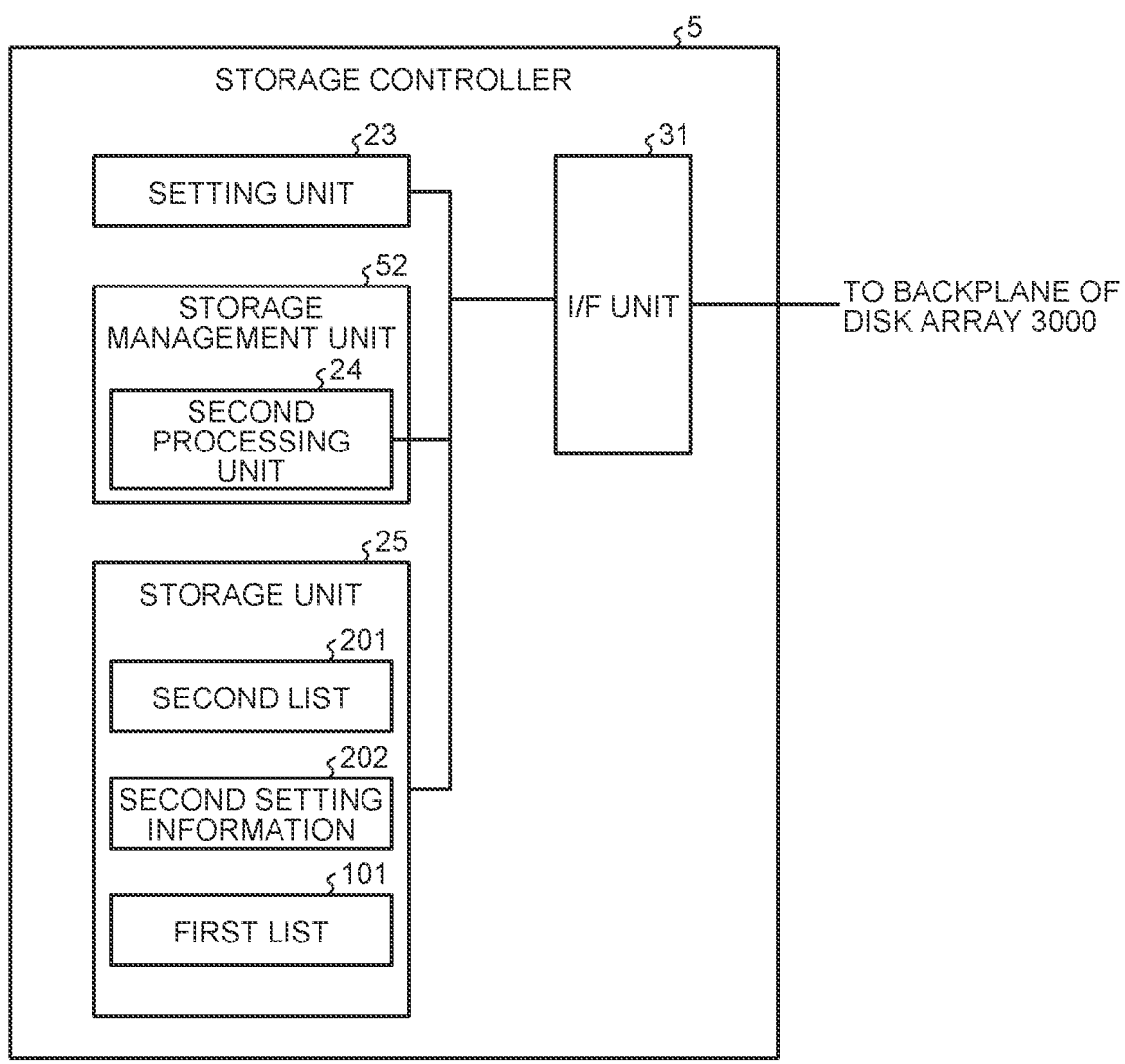
FIG. 20 is a diagram illustrating an exemplary configuration of a storage controller.

FIG. 20 is a diagram illustrating an exemplary configuration of the storage controller 5. The same components as those of the first embodiment will be denoted with the same symbols and the same names, and the redundant descriptions will not be repeated.

The storage controller 5 includes the I/F unit 31, the setting unit 23, a storage management unit 52, and the memory unit 25. The memory unit 25 stores the second list 201, the second setting information 202, and the first list 101 therein. The I/F unit 31 is connected to each memory system 1 through the backplane of the server rack, and performs control on communication between each memory system 1 and the storage controller 5. The storage management unit 52 performs the structuring of the RAID, the virtualization of the storage, and the mirroring of the storage.

The virtualization of the storage is a technology of integrating the plurality of memory systems 1 into one virtual storage device (storage pool). The storage management unit 52 configures one storage pool using two or more memory systems 1 among the plurality of memory systems 1 provided in the server rack. The storage management unit 52 generates a virtual volume from the storage pool, and supplies the generated virtual volume to each host 4 as an external storage. Further, the volume is a lump of storage area assigned with consecutive addresses which can be used by each host 4 to indicate a location. The storage management unit 52 manages the physical storage areas supplied from one or more memory systems 1 as one virtual volume (hereinafter, referred to as a virtual volume) through address conversion. The physical storage area supplied by the memory system 1 for the virtual volume is denoted by a physical volume. The storage area structured by the RAID belongs to a concept of the physical volume. In other words, the storage management unit 52 can structure the virtual volume using the storage area structured by the RAID. The storage management unit 52 may supply both the virtual volume and the physical volume to each host 4. The storage management unit 52 generates one or more virtual volumes from one storage pool.

The mirroring of the storage is a technology in which a group is composed of two or more volumes, and a copy of the data stored in one volume (primary volume) belonging to the group is also stored in another volume (secondary volume) belonging to the group. The number of secondary volumes is not limited to a specific numbers. The storage management unit 52 performs the structuring of the group and the writing of the copy of data to the secondary volume. The volumes forming the mirroring group may be the physical volumes, or may be the virtual volumes. Herein, it is assumed that the storage management unit 52 constitutes the mirroring group using a plurality of volumes in one disk array 3000. In a case where the disk array 3000 is connected to another storage device through a network, the storage management unit 52 may use the another storage device as the secondary volume.

The storage management unit 52 includes the second processing unit 24. The second processing unit 24 can perform a plurality of modes of data recovery. Each mode of the data recovery belongs to a concept of the error correction. The mode of data recovery performed by the second processing unit 24 will be described.

(1) Data Recovery Using RAID

The second processing unit 24 performs the data recovery using the RAID.

(2) Data Recovery Using Secondary Volume

In a case where the report "Unrecovered Error" is received in response to the second read request for the primary volume, the second processing unit 24 acquires the copy of target data of the second read request from the secondary volume. In a case where the number of secondary volumes is "2" or more and the report "Unrecovered Error" is received in response to the read request for one secondary volume, the second processing unit 24 may acquire the copy from another secondary volume. Further, restoration of the data stored in the primary volume may be performed at any timing. The second processing unit 24 may perform the restoration of the data in the primary volume after the data is transmitted to the host 4 at the transmission source of the first read request, or may perform the restoration of the data in the primary volume before the data is transmitted to the host 4 at the transmission source of the first read request.

The mode of the data recovery which can be performed by the above-mentioned second processing unit 24 is previously described in the second list 201. In the second list 201, the correction capability and the correction time are described for each mode. The mode which is allowed to be performed by the second processing unit 24 is described in the second setting information 202. The second setting information 202 is generated by the setting unit 23. The second processing unit 24 performs the data recovery of the mode described in the second setting information 202 in response to the report "Unrecovered Error".

Further, the host 4 may not be mounted in the server rack. In addition, the storage controller 5 may be eliminated from the disk array 3000, and the function of the storage controller 5 may be installed in the host 4. The function of the storage controller 5 may be installed in the host 4 by software, hardware, or a combination of the software and the hardware.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
    a first memory;
    an interface circuit configured to receive a first command from an external device, device and receive a second command from the external device after receiving the first command, the first command including information including of a time limit of an error correction to be executed in the memory system, the second command specifying to read data from the first memory; and
    a processor circuitry configured to:
    select a mode among a first plurality of modes of error correction based on the time limit included in the received first command, the first plurality of modes of error correction being a plurality of kinds of error correction which the memory system is capable of performing;
    read the data from the first memory after receiving the second command;
    perform, on the read data, an error correction corresponding to the selected mode; and
    send a response including unrecovered error to the external device based on a failure of the error correction on the read data.

2. The memory system according to claim 1, further comprising:
    a second memory configured to store information specifying the first plurality of modes of error correction and processing time for each of the first plurality of modes of error correction, each of the first plurality of modes of error correction corresponding to one of the plurality of kinds of error correction which the memory system is capable of performing on data read from the first memory.

3. The memory system according to claim 1, wherein the processor circuitry is configured to:
    select a second plurality of modes of error correction among the first plurality of modes of error correction based on the time limit included in the received first command and processing time for each of the first plurality of modes; and
    select the mode among the second plurality of modes of error correction.

4. The memory system according to claim 3, wherein the processor circuitry is configured to select the second plurality of modes so that total of processing times for the second plurality of modes is less than the time limit included in the received first command.

5. The memory system according to claim 1, wherein the first memory includes a NAND type flash memory.

6. The memory system according to claim 1, wherein the interface circuit is in conformity with SCSI (small computer system interface) standard or PCI Express standard.

7. The memory system according to claim 1, wherein the processor circuitry selects the mode such that latency for performing the second command using error correction corresponding to the mode does not exceed an upper limit time.

8. A method for controlling a memory system which includes a first memory, the method comprising:
    receiving a first command from an external device and receiving a second command from the external device after receiving the first command, the first command including information of a time limit of an error correction to be executed in the memory system, the second command specifying to read data from the first memory;
    selecting a mode among a first plurality of modes of error correction based on the time limit included in the received first command, the first plurality of modes of error correction being a plurality of kinds of error correction which the memory system is capable of performing;
    reading the data from the first memory after receiving the second command;
    performing, on the read data, an error correction corresponding to the selected mode; and
    sending a response including unrecovered error to the external device based on a failure of the error correction on the read data.

9. The method according to claim 8, further comprising:
    storing information specifying the first plurality of modes of error correction and processing time for each of the first plurality of modes of error correction, each of the first plurality of modes of error correction corresponding to one of the plurality of kinds of error correction which the memory system is capable of performing on data read from the first memory.

10. The method according to claim 5, wherein the selecting the mode includes:

selecting a second plurality of modes of error correction among the first plurality of modes of error correction based on the time limit included in the received first command and processing time for each of the first plurality of modes; and selecting the mode among the second plurality of modes of error correction.

11. The method according to claim 10, wherein selecting the second plurality of modes of error correction is selecting the second plurality of modes so that total of processing times for the second plurality of modes is less than the time limit included in the received first command.

12. The method according to claim 8, wherein the first memory includes a NAND type flash memory.

13. The method according to claim 8, wherein the receiving the information is in conformity with SCSI standard or PCI Express standard.

14. The method according to claim 8, wherein the selecting a mode comprises selecting the mode such that latency for performing the second command using error correction corresponding to the mode does not exceed an upper limit time.

\* \* \* \* \*